(12) United States Patent
Barrow (10) Patent No.: US 8,384,431 B2
(45) Date of Patent: Feb. 26, 2013

(54) VOLTAGE LEVEL SHIFTING APPARATUSES AND METHODS

(75) Inventor: Jeffrey G. Barrow, Tucson, AZ (US)

(73) Assignee: Integrated Device Technology, Inc., San Jose, CA (US)

( * ) Notice: Subject to any disclaimer, the term of this patent is extended or adjusted under 35 U.S.C. 154(b) by 6 days.

(21) Appl. No.: 12/964,246

(22) Filed: Dec. 9, 2010

(65) Prior Publication Data
US 2012/0146688 A1 Jun. 14, 2012

(51) Int. Cl.
*H03K 19/0175* (2006.01)
*H03L 5/00* (2006.01)

(52) U.S. Cl. ......................................... 326/68; 327/333

(58) Field of Classification Search .................. None
See application file for complete search history.

(56) References Cited

U.S. PATENT DOCUMENTS

| | | | |
|---|---|---|---|
| 4,486,670 A * | 12/1984 | Chan et al. | 326/81 |
| 4,532,436 A | 7/1985 | Bismarck | |
| 4,980,583 A | 12/1990 | Dietz | |
| 5,995,423 A * | 11/1999 | Lakhani et al. | 365/200 |
| 6,049,228 A | 4/2000 | Moon | |
| 6,064,227 A * | 5/2000 | Saito | 326/68 |
| 6,084,459 A | 7/2000 | Jeong | |
| 6,107,857 A | 8/2000 | Orisaka et al. | |
| 6,433,582 B2 * | 8/2002 | Hirano | 326/68 |
| 6,522,323 B1 | 2/2003 | Sasaki et al. | |
| 6,888,394 B2 | 5/2005 | Cleary et al. | |
| 7,038,521 B2 | 5/2006 | Cleary et al. | |
| 7,071,758 B2 | 7/2006 | Tseng et al. | |
| 7,151,400 B2 * | 12/2006 | Chen | 327/333 |
| 7,397,278 B2 | 7/2008 | Nakao | |
| 2007/0164805 A1 | 7/2007 | Horibata et al. | |
| 2008/0238523 A1 | 10/2008 | Thorp et al. | |

OTHER PUBLICATIONS

Tran et al., "Low-power High-Speed Level Shifter Design for Block-level Dynamic Voltage Scaling Environment", Institute of Industrial Science and Center for Collaborative Research, University of Tokyo, pp. 229-232, Tokyo, Japan.

* cited by examiner

*Primary Examiner* — Crystal L Hammond
(74) *Attorney, Agent, or Firm* — Traskbritt P.C.

(57) ABSTRACT

Level shifting circuits and related methods are disclosed herein. The level shifting circuit includes a cross-coupled pull-up circuit coupled to a higher supply voltage, an output signal, and an inverted output signal. An input signal transitions between a ground and a lower supply voltage and an inverted input signal transitions in a direction opposite from the input signal between the ground and the lower supply voltage. A first n-channel transistor has a gate coupled to the lower supply voltage, a drain coupled to the output signal, and a source coupled to the inverted input signal. A second n-channel transistor has a gate coupled to the lower supply voltage, a drain coupled to the inverted output signal, and a source coupled to the input signal. The level shifting circuit may be included in an IC with core logic in a first voltage domain and input/output logic in a second voltage domain.

21 Claims, 4 Drawing Sheets

VOLTAGE LEVEL SHIFTING APPARATUSES AND METHODS

TECHNICAL FIELD

Embodiments of the present disclosure relate generally to voltage level shifting and, more particularly, to apparatuses and methods related to high voltage shifters that may have reduced output delays.

BACKGROUND

Advanced digital Integrated Circuit (IC) devices often have a low voltage logic core and relatively higher voltage Input/Output (IO) logic for interface with external components on a printed circuit board. As a result, voltage level translation circuits to translate from the low voltage domain to a high voltage domain are common and many such devices may be needed on an IC. Therefore, a logic level shifter that consumes minimum power and minimum die area while introducing minimum delay in the digital signal path is valuable to a very wide range of digital circuit applications including LCD panels, cell phones, MP3 players, microprocessors, memories, and many more devices.

Level shift circuits (also referred to herein as level shifters) change the voltage level of a signal between an input and an output. For example, when an output voltage of a first circuit differs from an operating voltage range of a second circuit, a level shifter may be arranged between the first circuit and the second circuit, and the voltage level of the signal between the first and second circuits may be adjusted.

Figure 1:
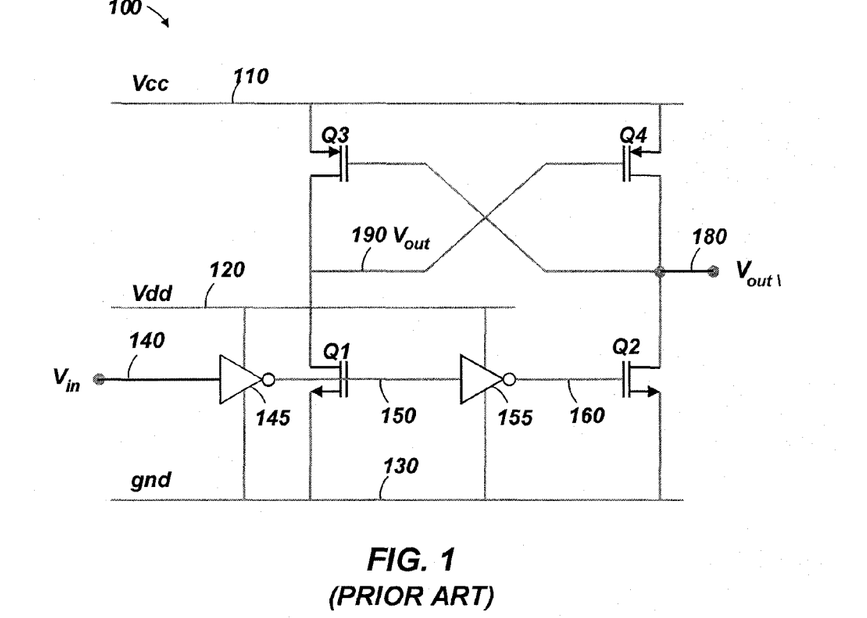
FIG. 1 illustrates a schematic diagram of a conventional level shift circuit.

FIG. 1 illustrates a schematic diagram of a conventional level shift circuit 100. Conventional level shift circuit 100 includes n-channel transistors Q1 and Q2 and p-channel transistors Q3 and Q4. A primary input ($V_{in}$) 140 is inverted by inverter 145 to drive a gate of n-channel transistor Q1 with an inverted input signal 150. The inverted input signal 150 drives a second inverter 155 to generate an input signal 160, which drives a gate of the n-channel transistor Q2. An inverted output signal ($V_{out}$) 180 is driven by the inverter combination of p-channel transistor Q4 and n-channel transistor Q2. An output signal ($V_{out}$) 190 is driven by the inverter combination of p-channel transistor Q3 and n-channel transistor Q1. The output signal 190 and inverted output signal 180 are cross-coupled to assist in making the voltage transitions on the two outputs.

In this conventional level shift circuit 100, the primary input 140 and the two inverters (145 and 155) operate between a ground 130 and a low supply voltage (Vdd) 120. The cross-coupled inverters of transistors Q1, Q3, Q2, and Q4 operate at a high supply voltage (Vcc) 110.

In operation, when the primary input 140 transitions from a low to a high of the low supply voltage 120, the inverted input signal 150 transitions from a high to a low, which turns off n-channel transistor Q1. The input signal 160 transitions from a low to a high, which turns on n-channel transistor Q2. As a result, n-channel transistor Q2 begins pulling the inverted output signal 180 low. However, p-channel transistor Q4 is also on at this time causing a fight between n-channel transistor Q2 and p-channel transistor Q4. This fight, when both transistors of an inverter are on, is often referred to as "shoot-through current" because current can flow through the inverter directly from the high supply voltage 110 to ground 130 in addition to supplying current to charge the inverted output signal 180.

As the inverted output signal 180 begins going low, p-channel transistor Q3 will turn on. N-channel transistor Q1 is now turned off so p-channel transistor Q3 can pull the output signal 190 high. As the output signal 190 goes high, p-channel transistor Q4 is turned off releasing the fight between p-channel transistor Q4 and n-channel transistor Q2. As a result, n-channel transistor Q2 can now easily pull the inverted output signal 180 the rest of the way low. Operation in the opposite direction (i.e., when the primary input 140 transitions from a high to a low) is similar except the shoot-through current occurs between p-channel transistor Q3 and n-channel transistor Q1.

Reduction of the shoot-through current is the subject of many modifications to the basic conventional level shifter, e.g., in an effort to reduce power and reduce propagation delays from a primary input to an output signal and an inverted output signal. As one such example, see U.S. Patent Application No. 2008/0238523. However, most proposals add additional circuitry and complexity in an effort reduce power or reduce propagation delays.

Other, less complex solutions are desirable. The inventor has appreciated that there exists a need for a level shifter that can reduce delays, reduce circuit complexity, reduce overall die size, or combinations thereof

BRIEF SUMMARY OF THE INVENTION

Embodiments of the present invention include apparatuses and methods for voltage level shifting that reduce delays, reduce circuit complexity, reduce overall die size, or combinations thereof.

An embodiment of the present invention relates to a level shift circuit that includes a cross-coupled pull-up circuit operably coupled to a higher supply voltage, an output signal, and an inverted output signal. An input signal is configured to transition between a ground and a lower supply voltage and an inverted input signal is configured to transition in a direction opposite from the input signal between the ground and the lower supply voltage. A first n-channel transistor has a gate operably coupled to the lower supply voltage, a drain operably coupled to the output signal, and a source operably coupled to the inverted input signal. A second n-channel transistor has a gate operably coupled to the lower supply voltage, a drain operably coupled to the inverted output signal, and a source operably coupled to the input signal.

Another embodiment of the present invention relates to an integrated circuit including core logic in a first voltage domain between a low potential and a lower supply voltage input/output (IO) logic in a second voltage domain between the low potential and a higher supply voltage. At least one level shift circuit includes a first p-channel transistor, a second p-channel transistor and two n-channel transistors. The first p-channel transistor is in the second voltage domain with a gate operably coupled to an output signal and a drain operably coupled to an inverted output signal. The second p-channel transistor is in the second voltage domain with a gate operably coupled to the inverted output signal and a drain operably coupled to the output signal. Each of the two n-channel transistors has its gate operably coupled to the lower supply voltage. One n-channel transistor of the two is configured to pull the inverted output signal to the low potential when its source is pulled to the low potential and another n-channel transistor of the two is configured to pull the output signal to the low potential when its source is pulled to the low potential. The drain of the other n-channel transistor is operably coupled to an input signal and the drain of the one n-channel transistor is operably coupled to an inverted input signal transitioning in an opposite direction from a transition of the input signal.

A particular embodiment of the present invention relates to a method for shifting an input voltage level to a different output voltage level. The method includes pulling down an output signal from a higher supply voltage to a ground potential with a first n-channel transistor by lowering its source from a lower supply voltage to the ground potential and with its non-transitioning gate held at the lower supply voltage. A second n-channel transistor is turned off by raising its source from the ground potential to the lower supply voltage and with its non-transitioning gate held at the lower supply voltage. An inverted output signal is pulled up from the ground potential to the higher supply voltage with a second p-channel transistor having a gate operably coupled to the output signal being pulled down. The method also includes turning off a first p-channel transistor having a gate operably coupled to the output signal being pulled up.

Yet another embodiment of the present invention relates to a method for shifting an input voltage level to a different output voltage level. The method includes turning off a first n-channel transistor operably coupled between a low potential and an output signal. The output signal is charged from the low potential to a higher supply voltage by turning on a first p-channel transistor operably coupled between the higher supply voltage and the output signal. Charging the output signal is assisted by charging a source-side node of a first drain-to-source capacitor of the first n-channel transistor from the low potential to a lower supply voltage. A second p-channel transistor operably coupled between the higher supply voltage and the output signal is turned off. An inverted output signal is discharged from the higher supply voltage to the lower potential by turning on a second n-channel transistor operably coupled between the low potential and the inverted output signal. The discharging the inverted output signal is assisted by discharging a source-side node of a second drain-to-source capacitor of the second n-channel transistor from the lower supply voltage to the low potential.

Other embodiments of the present invention relate to methods for shifting an input voltage level to a different output voltage level. The method includes turning off a first n-channel transistor operably coupled between a low potential and an output signal. The output signal is charged from the low potential to a higher supply voltage by turning on a first p-channel transistor operably coupled between the higher supply voltage and the output signal. The method also includes turning off a second p-channel transistor operably coupled between the higher supply voltage and the output signal. An inverted output signal is discharged from the higher supply voltage to the lower potential by turning on a second n-channel transistor operably coupled between the low potential and the inverted output signal. A discharging time of the inverted output signal is reduced by maintaining a gate-side node of a second gate-to-drain capacitor of the second n-channel transistor at a lower supply voltage.

DETAILED DESCRIPTION

In the following description, elements, circuits, and functions may be shown in block diagram form in order not to obscure the present invention in unnecessary detail. Conversely, specific implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Furthermore, in this description of embodiments of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise a set of elements may comprise one or more elements.

Embodiments of the present invention include apparatuses and methods for voltage level shifting that reduce delays, reduce circuit complexity, reduce overall die size, or combinations thereof.

Various voltage levels are discussed herein. As used herein a higher supply voltage refers to a supply voltage that is higher than a lower supply voltage. The embodiments discussed herein modify signals in a first voltage domain between a low potential (e.g., a ground potential) and the lower supply voltage to related signals in a second voltage domain between the low potential and the higher supply voltage. Non-limiting examples for the lower supply voltage are voltages in a range of about 1.2 to 3.3 volts. Non-limiting examples for the higher supply voltage are voltages in a range of about 3.3 volts to 5.0 volts. As a result, for most IC processes the transistors used in embodiments of the present invention may be configured as "low voltage" transistors with minimum or near minimum gate widths.

Figure 2:
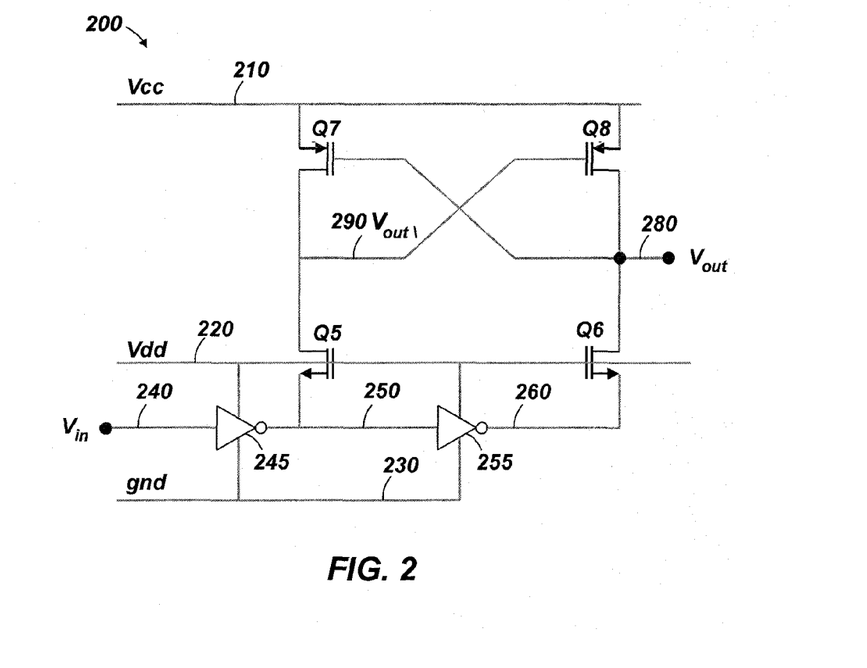
FIG. 2 illustrates a schematic diagram of a level shift circuit according to an embodiment of the present invention.
Figure 3:
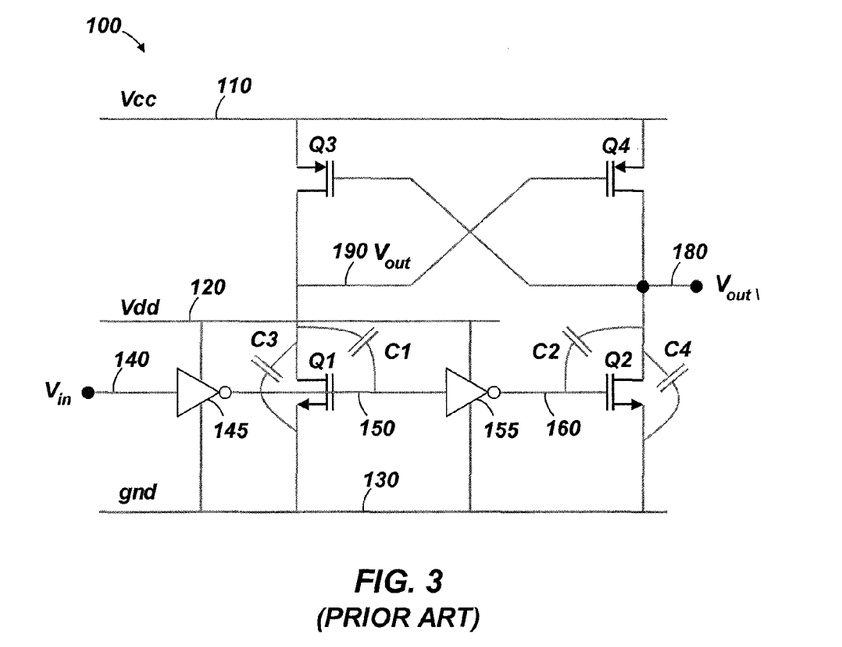
FIG. 3 illustrates a schematic diagram of the conventional level shift circuit of FIG. 1 and includes some parasitic capacitors for some of the transistors.
Figure 4:
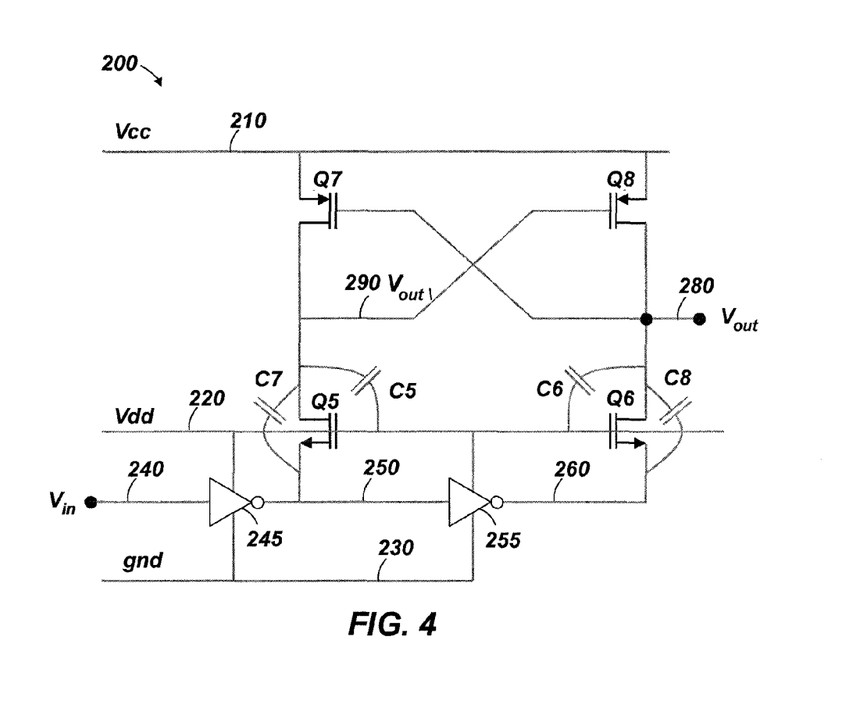
FIG. 4 illustrates a schematic diagram of the level shift circuit of FIG. 2 according to a particular embodiment of the present invention and includes some parasitic capacitors for some of the transistors.

Devices and signals in the conventional circuits of FIGS. 1 and 3 and embodiments of the present invention in FIGS. 2 and 4 may have similar alphanumeric indicators. This loose correlation is done to make explanations of the circuits easier to follow. The similarities in alphanumeric indicators in no way imply that the devices or signals indicated are equivalent unless expressly stated as such.

FIG. 2 illustrates a schematic diagram of a level shift circuit 200 according to an embodiment of the present invention. The level shift circuit 200 includes a first n-channel transistor Q5, a second n-channel transistor Q6, a first p-channel transistor Q7, and a second p-channel transistor Q8. A combination of the first p-channel transistor Q7 and the second p-channel transistor Q8 may be referred to herein as a cross-coupled pull-up circuit. A primary input ($V_{in}$) 240 is inverted by a first inverter 245 to drive a source of the first n-channel transistor Q5 with an inverted input signal 250. The inverted input signal 250 drives a second inverter 255 to generate an input signal 260, which drives a source of the second n-channel transistor Q6. An output signal ($V_{out}$) 280 is driven by an inverter combination of the second p-channel transistor Q8 and the second n-channel transistor Q6. An inverted output signal ($V_{out}$) 290 is driven by an inverter combination of the first p-channel transistor Q7 and the first n-channel transistor Q5. The output signal 280 and the inverted output signal 290 are cross-coupled to assist in making the voltage transitions on the two outputs (280 and 290).

In this level shift circuit 200, the primary input 240 and the two inverters (245 and 255) operate between a ground 230 and a lower supply voltage (Vdd) 220. The cross-coupled inverters of transistors Q4, Q7, Q6, and Q8 operated at a higher supply voltage (Vcc) 210.

The conventional level shift circuit 100 of FIG. 1 has the n-channel transistors Q1 and Q2 connected in a conventional manner with the inverters (145 and 155) respectively driving gates of the n-channel transistors Q1 and Q2 while the sources of n-channel transistors Q1 and Q2 are connected to ground 130. In contrast, in embodiments of the present invention, as illustrated in FIG. 2, the gates of the first n-channel transistor Q5 and the second n-channel transistor Q6 are coupled to the lower supply voltage 220 such that the voltage potential on the gates is substantially constant (may also be referred to herein as non-transitioning gates). Instead, the source of the first n-channel transistor Q5 is connected to the inverted input signal 250 and the source of the second n-channel transistor Q6 is connected to the output signal 290. Thus, to turn the first and second n-channel transistor (Q5 and Q6) on, the source node is lowered to ground 130 while the gate node is held at the lower supply voltage 220. Conversely, to turn the first and second n-channel transistor (Q5 and Q6) off, the source node is raised to the lower supply voltage 220 while the gate node is held at the lower supply voltage 220.

With this configuration, and as explained below, embodiments of the present invention provide improved propagation delays relative to the conventional level shifter without adding any additional components or even changing the size of the components.

In operation, when the primary input 240 transitions from a high to a low, the inverted input signal 250 transitions from a low to a high, which shuts off the first n-channel transistor Q5. The inverted input signal 250 drives the second inverter 255 such that the input signal 260 transitions from a high to a low, which turns on the second n-channel transistor Q6. As a result, the second n-channel transistor Q6 begins pulling the output signal 280 low. However, the second p-channel transistor Q8 is also on at this time causing a fight between the second n-channel transistor Q6 and the second p-channel transistor Q8. As stated above, this fight when both transistors of an inverter are on is often referred to as "shoot-through current" or "shoot-through" current because current can flow through the inverter directly from the higher supply voltage 210 to ground 230 in addition to supplying current to charge the output signal 280.

As the output signal 280 begins going low, the first p-channel transistor Q7 will turn on. The first n-channel transistor Q5 is now turned off so the first p-channel transistor Q7 can easily pull the inverted output signal 290 high. As the inverted output signal 290 goes high, the second p-channel transistor Q8 is turned off releasing the fight between the second p-channel transistor Q8 and the second n-channel transistor Q6. As a result, the second n-channel transistor Q6 can now easily pull the inverted output signal 280 the rest of the way low. Operation in the opposite direction (i.e., when the primary input 240 transitions from a low to a high) is similar except the shoot-through current occurs between the first p-channel transistor Q7 and the first n-channel transistor Q5.

Although no new transistors are added and the various devices may remain unchanged, the new method, in embodiments of the present invention, has substantially better level shifter performance due to the relocation of parasitic capacitances such that the effects of stray charge are minimized in one pair of parasitic capacitors and used for benefit in a second pair of parasitic capacitors.

FIG. 3 illustrates a schematic diagram of the conventional level shift circuit of FIG. 1 and includes some parasitic capacitors for some of the transistors. A first gate-to-drain capacitor C1 and a first drain-to-source capacitor C3 are shown coupled to the first n-channel transistor Q1. Similarly, a second gate-to-drain capacitor C2 and a second drain-to-source capacitor C4 are shown coupled to the second n-channel transistor Q2.

FIG. 4 illustrates a schematic diagram of the level shift circuit of FIG. 2 according to an embodiment of the present invention and includes some parasitic capacitors for some of the transistors. A first gate-to-drain capacitor C5 and a first drain-to-source capacitor C7 are shown coupled to the first n-channel transistor Q5. Similarly, a second gate-to-drain capacitor C6 and a second drain-to-source capacitor C8 are shown coupled to the second n-channel transistor Q6.

In the conventional level shift circuit 100 of FIG. 3, parasitic gate-to-drain capacitors C1 and C2 act with Miller multiplication thereby increasing overall delay of the circuit. Consider n-channel transistors Q2 and Q4 for example. The charge moving in to gate-to-drain capacitors C1 and C2 is proportional to the voltage across its terminals. But, for example, when the gate of Q2 goes high, the drain will go low so the changing voltage across C2 will increase by a factor of the gate-to-drain voltage gain. In other words, $C2_{miller}=C2*(1+Av_{drain-to-gate})$. The "1" comes from the gate going up while the $Av_{drain-to-gate}$ factor comes from the drain going down. The same effect is true for the reverse operation and for the other parasitic gate-to-drain capacitor C1.

Drain-to-source capacitors C3 and C4 act to oppose the velocity of the output signal 190 and the inverted output signal 180, respectively. As the output signal 190 changes, charge must be delivered or removed from drain-to-source capacitor C3. Similarly, as the inverted output signal 180 changes, charge must be delivered or removed from drain-to-source capacitor C4.

In the level shift circuit 200 of FIG. 4 according to embodiments of the present invention, the Miller multiplication effect of gate-to-drain capacitors C5 and C6 is eliminated and replaced with simple parasitic load capacitance because the gate-side nodes of the gate-to-drain capacitors (C5 and C6) are held constant at the lower supply voltage 220. Thus, there is no Miller multiplication, and hence, the outputs of the input inverters (245 and 255) may be unloaded to a degree, and the parasitic loads on the output signal 290 and the inverted output signal 280 may be proportionally reduced by a factor of $AV_{drain-to-gate}$. As a result, the first gate-to-drain capacitor C5 and the second gate-to-drain capacitor C6 can reduce a discharge time of their corresponding output signal relative to the conventional circuit's gate-to-drain capacitors (C1 and C2 in FIG. 3).

In addition, the first drain-to-source capacitor C7 and the second drain-to-source capacitor C8 include a supportive charge transfer action due to the transitions on the source nodes in the same direction as the transitions on the drain nodes as explained above. This supportive charge transfer may improve the level shift circuit's propagation delay. For example, consider the second inverter 255 driving the source of the second n-channel transistor Q6. When the input signal 260 is low, the output signal 280 will also be low. Similarly, when the input signal 260 is high, the output signal 280 will be high. In other words, these two signals are in phase. For example, as the charge on the source-side node of the second drain-to-source capacitor C8 moves up, the charge on the drain-side node is also moving up so the differential voltage across the capacitor is maintained at a lower voltage than for the conventional circuit of FIG. 3. Conversely, as the charge on the source-side node of the second drain-to-source capacitor C8 moves down, the charge on the drain-side node is also moving down so the differential voltage across the capacitor is maintained at a lower voltage than for the conventional circuit of FIG. 3.

The same analysis applies to the inverted input signal 250 and the inverted output signal 290 across the first n-channel transistor Q5. On transition of the inverted input signal 250, charge transfers from the output of the low voltage first inverter 245 to the inverted output signal 290. In particular, this charge transfer may be helpful when switching an output from a low state to a high state. For example, in the conventional level shift circuit 100 of FIG. 3, the second p-channel transistor Q4 is necessarily weaker than the second n-channel transistor Q2 so that the second n-channel transistor Q2 can overcome the shoot-through current when switching the inverted output signal 180 from a high state to a low state. Consequently, the relatively weak second p-channel transistor Q4 is unable to deliver the necessary charge to pull up the inverted output signal 180 as quickly as the second n-channel transistor Q2 can pull it down.

In contrast, in the embodiment of the present invention illustrated in FIG. 4, the additional charge boost from the second drain-to-source capacitor C8, for example, helps the output signal 280 in both rising and falling transitions. When the output signal 280 begins rising, Vgs of the first p-channel transistor Q7 is reduced, which in turn reduces the on state of the first p-channel transistor Q7. With the first p-channel transistor Q7 turning off, its drain can drop faster due to the action of the first n-channel transistor Q5 and an assist from the charging of the source-side node of the first drain-to-source capacitor C7. A similar analysis would apply to the second n-channel transistor Q6 and the second drain-to-source capacitor C8.

Figure 5:
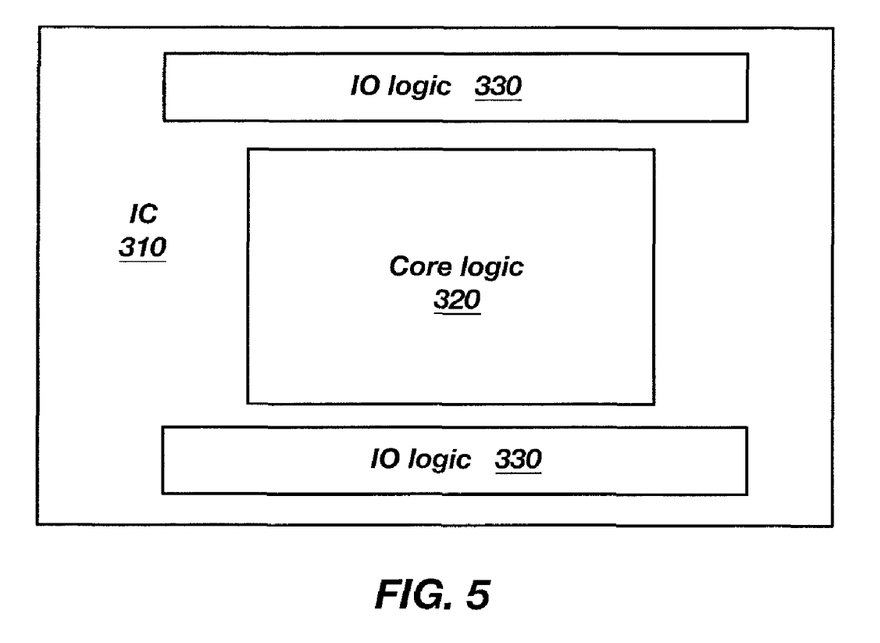
FIG. 5 illustrates an IC with core logic and IO logic configured for operation in two different voltage domains.

FIG. 5 illustrates an IC 310 with core logic 320 and IO logic 330 configured for operation in two different voltage domains. FIG. 5 is an example only and not meant to limit topology of how the different voltage domains may be configured. In addition, voltage level shift circuits 200 (not shown in FIG. 5) may be placed in or near the core logic 320, in or near the IO logic 330, or in both places.

Figure 6:
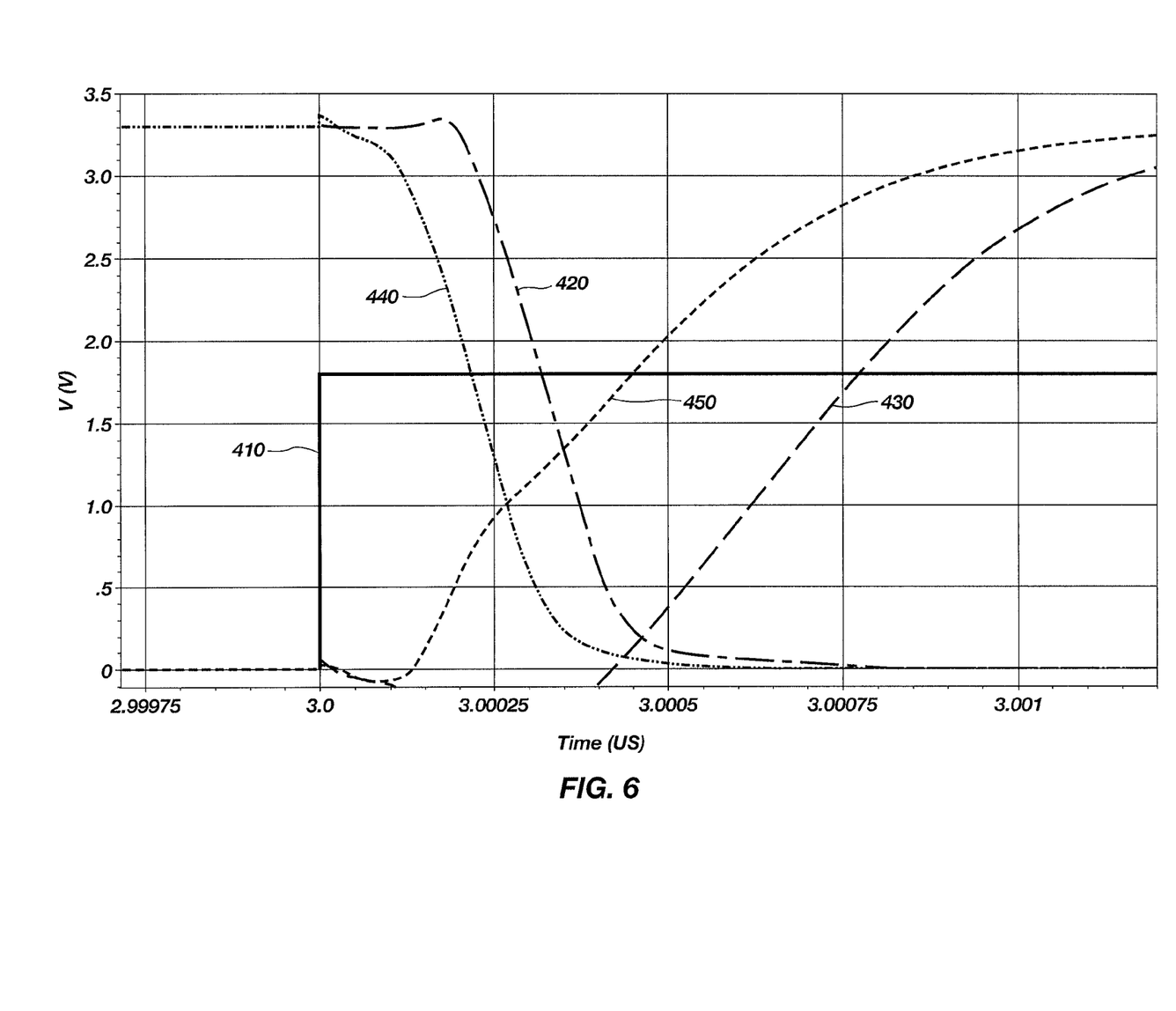
FIG. 6 illustrates a timing waveform showing an improvement in propagation delay between the conventional level shift circuit of FIGS. 1 and 3 and the level shift circuit according to an embodiment of the present invention as illustrated in FIGS. 2 and 4.

FIG. 6 illustrates a timing waveform showing an improvement in propagation delay between the conventional level shift circuit of FIGS. 1 and 3 and the level shift circuit according to an embodiment of the present invention as illustrated in FIGS. 2 and 4. Waveform 410 represents an input of the primary input 240 for embodiments of the present invention illustrated in FIGS. 2 and 4 and the primary input 140 for the conventional circuit illustrated in FIGS. 1 and 3. In this example, the primary input (140 and 240) is in the first voltage domain and swings between about zero and 1.8 volts. Waveform 420 represents the inverted output signal 180 and waveform 430 represents the output signal 190 of the conventional circuit. In contrast, waveform 440 represents the inverted output signal 290 and waveform 450 represents the output signal 280 for an embodiment of the present invention. Both the conventional circuit and the embodiment of the present invention are configured with the higher supply voltage (110 and 210) at about 3.5 volts. As can be seen, waveform 450 reaches a midpoint significantly faster than waveform 430 indicating a better propagation delay performance of the embodiment of the present invention relative to the conventional circuit.

As a non-limiting example, the simulations for the embodiment of the present invention and the conventional circuit were performed with the same device sizes for both circuits. For these simulations, the p-channel transistors have W/L sizes of 8/0.5 microns and the n-channel transistors have W/L sizes of 4/0.5 microns. The inverters are configured with p-channel transistors of 10/0.5 microns and n-channel transistors of 4/0.5 microns.

While the present invention has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A level shift circuit, comprising:
    a cross-coupled pull-up circuit operably coupled to a higher supply voltage in a range of about 3.3 to 5 volts, an output signal, and an inverted output signal;
    an input signal configured to transition between a ground and a lower supply voltage below 3.3 volts and down to 1.2 volts;
    an inverted input signal configured to transition in a direction opposite from the input signal and between the ground and the lower supply voltage;
    a first n-channel transistor with a gate operably coupled to the lower supply voltage, a drain operably coupled to the output signal, and a source operably coupled to the inverted input signal; and
    a second n-channel transistor with a gate operably coupled to the lower supply voltage, a drain operably coupled to the inverted output signal, and a source operably coupled to the input signal.

2. The level shift circuit of claim 1, wherein the cross-coupled pull-up circuit comprises:

a first p-channel transistor with a gate operably coupled to the output signal, a source operably coupled to the higher supply voltage, and a drain operably coupled to the output signal; and a second p-channel transistor with a gate operably coupled to the inverted output signal, a source operably coupled to the higher supply voltage, and a drain operably coupled to the inverted output signal.

3. The level shift circuit of claim 1, further comprising:

a first inverter operably coupled between a primary input and the inverted input signal, the first inverter configured to transition the inverted input signal between the ground and the lower supply voltage; and a second inverter operably coupled between the inverted input signal and the input signal, the second inverter configured to transition the input signal between the ground and the lower supply voltage.

4. The level shift circuit of claim 1, wherein the higher supply voltage is in a range of about 3.3 to 5 volts and the lower supply voltage is in a range of about 1.2 to 3.3 volts.

5. An integrated circuit, comprising:

core logic of the integrated circuit in a first voltage domain below 3.3 volts and down to 1.2 volts between a low potential and a lower supply voltage;

input/output (IO) logic of the integrated circuit in a second voltage domain in a range of about 3.3 to 5 volts between the low potential and a higher supply;

at least one level shift circuit, comprising:

a first p-channel transistor in the second voltage domain with a gate operably coupled to an output signal and a drain operably coupled to an inverted output signal;

a second p-channel transistor in the second voltage domain with a gate operably coupled to the inverted output signal and a drain operably coupled to the output signal; and two n-channel transistors each with its gate operably coupled to the lower supply voltage, one n-channel transistor of the two configured to pull the inverted output signal to the low potential when its source is pulled to the low potential and another n-channel transistor of the two configured to pull the output signal to the low potential when its source is pulled to the low potential;

wherein a drain of the other n-channel transistor is operably coupled to an input signal and a drain of the one n-channel transistor is operably coupled to an inverted input signal transitioning in an opposite direction from a transition of the input signal.

6. The integrated circuit of claim 5, wherein the at least one level shift circuit further comprises:

a first inverter operably coupled between an overall input and the input signal, the first inverter configured to operate an output thereof between a ground and the lower supply voltage; and a second inverter operably coupled between the input signal and the inverted version of the input signal, the second inverter configured to operate an output thereof between the ground and the lower supply voltage.

7. The integrated circuit of claim 5, wherein the second voltage domain is in a range of about 3.3 to 5 volts, the first voltage domain is in a range of about 1.2 to 3.3 volts, and the low potential is a ground.

8. A method for shifting an input voltage level to a different output voltage level, the method comprising:

pulling down an output signal from a higher supply voltage in a range of about 3.3 to 5 volts to a ground potential with a first n-channel transistor by lowering its source from a lower supply voltage in a range below 3.3 volts and down to 1.2 volts relative to the ground potential and with its non-transitioning gate held at the lower supply voltage;

turning off a second n-channel transistor by raising its source from the ground potential to the lower supply voltage and with its non-transitioning gate held at the lower supply voltage;

pulling up an inverted output signal from the ground potential to the higher supply voltage with a second p-channel transistor having a gate operably coupled to the output signal being pulled down; and turning off a first p-channel transistor having a gate operably coupled to the output signal being pulled up.

9. The method of claim 8, wherein:

lowering the source of the first n-channel transistor comprises driving the source from a first inverter with an output transitioning between the lower supply voltage and the ground; and raising the source of the second n-channel transistor comprises driving the source from a second inverter with an output transitioning between the ground potential and the lower supply voltage.

10. The method of claim 8, further comprising:

pulling down the inverted output signal from the higher supply voltage to the ground potential with the second n-channel transistor by lowering its source from the lower supply voltage to the ground potential and with its non-transitioning gate held at the lower supply voltage;

turning off the first n-channel transistor by raising its source from the ground potential to the lower supply voltage and with its non-transitioning gate held at the lower supply voltage;

pulling up the output signal from the ground potential to the higher supply voltage with the first p-channel transistor having a gate operably coupled to the inverted output signal being pulled down; and turning off the second p-channel transistor having a gate operably coupled to the output signal being pulled up.

11. The method of claim 10, wherein:

raising the source of the first n-channel transistor comprises driving the source from a first inverter with an output transitioning between the ground potential and the lower supply voltage; and lowering the source of the second n-channel transistor comprises driving the source from a second inverter with an output transitioning between the lower supply voltage and the ground potential.

12. A method for shifting an input voltage level to a different output voltage level, the method comprising:

turning off a first n-channel transistor operably coupled between a low potential and an output signal;

charging the output signal from the low potential to a higher supply voltage by turning on a first p-channel transistor operably coupled between the higher supply voltage and the output signal;

assisting the charging the output signal by charging a source-side node of a first drain-to-source capacitor of the first n-channel transistor from the low potential to a lower supply voltage;

turning off a second p-channel transistor operably coupled between the higher supply voltage and the output signal;

discharging an inverted output signal from the higher supply voltage to the low potential by turning on a second n-channel transistor operably coupled between the low potential and the inverted output signal; and assisting the discharging the inverted output signal by discharging a source-side node of a second drain-to-source capacitor of the second n-channel transistor from the lower supply voltage to the low potential.

13. The method of claim 12, further comprising further assisting the discharging the inverted output signal by maintaining a gate-side node of a second gate-to-drain capacitor of the second n-channel transistor at the lower supply voltage.

14. The method of claim 12, wherein:
turning off the first n-channel transistor comprises driving its source from a first inverter with an output transitioning between the lower supply voltage and the low potential; and
turning on the second n-channel transistor comprises driving its source from a second inverter with an output transitioning between the low potential and the lower supply voltage.

15. The method of claim 12, further comprising:
turning off the first p-channel transistor;
discharging the output signal from the higher supply voltage to the low potential by turning on the first n-channel transistor;
assisting the discharging the output signal by discharging the source-side node of the first drain-to-source capacitor from the lower supply voltage to the low potential;
turning off the second n-channel transistor;
charging the inverted output signal from the low potential to the higher supply voltage by turning on the second p-channel transistor; and
assisting the charging the inverted output signal by charging the source-side node of the second drain-to-source capacitor.

16. The method of claim 15, further comprising further assisting the discharging the output signal by maintaining a gate-side node of a first gate-to-drain capacitor of the first n-channel transistor at the lower supply voltage.

17. The method of claim 15, wherein:
turning on the first n-channel transistor comprises driving its source from a first inverter with an output transitioning between the low potential and the lower supply voltage; and
turning off the second n-channel transistor comprises driving its source from a second inverter with an output transitioning between the lower supply voltage and the low potential.

18. A method for shifting an input voltage level to a different output voltage level, the method comprising:
turning off a first n-channel transistor operably coupled between a low potential and an output signal;
charging the output signal from the low potential to a higher supply voltage in a range of about 3.3 to 5 volts by turning on a first p-channel transistor operably coupled between the higher supply voltage and the output signal;
turning off a second p-channel transistor operably coupled between the higher supply voltage and the output signal;
discharging an inverted output signal from the higher supply voltage to the low potential by turning on a second n-channel transistor operably coupled between the low potential and the inverted output signal; and
reducing a discharging time of the inverted output signal by maintaining a gate-side node of a second gate-to-drain capacitor of the second n-channel transistor at a lower supply voltage in a range below 3.3 volts and down to 1.2 volts.

19. The method of claim 18, wherein:
turning off the first n-channel transistor comprises driving its source from a first inverter with an output transitioning between the lower supply voltage and the low potential; and
turning on the second n-channel transistor comprises driving its source from a second inverter with an output transitioning between the low potential and the lower supply voltage.

20. The method of claim 18, further comprising:
turning off the first p-channel transistor;
discharging the output signal from the higher supply voltage to the low potential by turning on the first n-channel transistor;
reducing a discharging time of the output signal by maintaining a gate-side node of a first gate-to-drain capacitor of the first n-channel transistor at the lower supply voltage;
turning off the second n-channel transistor; and
charging the inverted output signal from the low potential to the higher supply voltage by turning on the second p-channel transistor.

21. The method of claim 20, wherein:
turning on the first n-channel transistor comprises driving its source from a first inverter with an output transitioning between the low potential and the lower supply voltage; and
turning off the second n-channel transistor comprises driving its source from a second inverter with an output transitioning between the lower supply voltage and the low potential.

* * * * *